(12) United States Patent
Shelat et al.

(10) Patent No.: US 8,531,196 B1
(45) Date of Patent: Sep. 10, 2013

(54) DELAY TEST CIRCUITRY

(75) Inventors: Jaydev Amit Shelat, Santa Clara, CA (US); Zunhang Yu Kasnavi, Sunnyvale, CA (US); Dhananjay Srinivasa Raghavan, Campbell, CA (US)

(73) Assignee: Altera Corporation, San Jose, CA (US)

( * ) Notice: Subject to any disclaimer, the term of this patent is extended or adjusted under 35 U.S.C. 154(b) by 934 days.

(21) Appl. No.: 12/365,147

(22) Filed: Feb. 3, 2009

(51) Int. Cl.
*G01R 31/3187* (2006.01)
*G01R 31/26* (2006.01)
*G01R 31/28* (2006.01)

(52) U.S. Cl.
CPC ........ *G01R 31/2884* (2013.01); *G01R 31/2831* (2013.01)
USPC .................................. 324/750.3; 324/762.05

(58) Field of Classification Search
None
See application file for complete search history.

(56) References Cited

U.S. PATENT DOCUMENTS

| | | | | |
|---|---|---|---|---|
| 3,222,595 A | * | 12/1965 | Granberg | 324/617 |
| 4,322,819 A | * | 3/1982 | Hyatt | 365/45 |
| 5,604,751 A | * | 2/1997 | Panis | 714/724 |
| 5,615,142 A | * | 3/1997 | Hyatt | 365/45 |
| 5,631,567 A | * | 5/1997 | Sporck et al. | 324/617 |
| 5,822,228 A | * | 10/1998 | Irrinki et al. | 714/718 |
| 6,366,115 B1 | * | 4/2002 | DiTommaso | 326/32 |
| 6,400,129 B1 | | 6/2002 | Yamaguchi | |
| 6,469,493 B1 | * | 10/2002 | Muething et al. | 324/762.01 |
| 6,476,594 B1 | | 11/2002 | Roisen | |
| 6,661,266 B1 | | 12/2003 | Variyam | |
| 7,301,836 B1 | * | 11/2007 | Raghavan et al. | 365/201 |
| 7,772,833 B2 | * | 8/2010 | Vijayaraghavan et al. | 324/750.3 |
| 7,949,916 B1 | * | 5/2011 | Ang | 714/726 |
| 7,952,376 B1 | * | 5/2011 | Yu Kasnavi et al. | 324/762.01 |

OTHER PUBLICATIONS

Synopsis, Inc. "TetraMAX ATPG: Automatic Test Pattern Generation." Synopsis, Inc. Datasheet, 2008.

* cited by examiner

*Primary Examiner* — Paresh Patel
(74) *Attorney, Agent, or Firm* — Treyz Law Group; Nancy Y. Ru

(57) ABSTRACT

Programmable delay test circuitry is provided for testing a circuit under test on an integrated circuit. Delay test circuitry may use logic circuitry to output an error signal when a delay time provided by the circuit under test is greater than a characteristic time that may be programmed into the programmable delay test circuitry. Programmable delay test circuitry may use a logic gate to provide a pulse that has a pulse width equal to the delay of the delay circuitry. Programmable delay test circuitry may contain a programmable load that may be programmed to have a characteristic time. Programmable delay test circuitry may assert an error signal when the delay time is greater than the characteristic time of the test circuitry.

19 Claims, 14 Drawing Sheets

DELAY TEST CIRCUITRY

BACKGROUND

This invention relates to testing delay generating circuits in integrated circuits such as programmable logic device integrated circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data files. The configuration data is loaded into memory elements on the programmable logic devices to configure the devices to perform the desired custom logic function.

During normal operation of a programmable logic device, loaded memory elements produce static output signals that are applied to the gates of metal-oxide-semiconductor (MOS) field-effect transistors (e.g., pass transistors). The memory element output signals turn some transistors on and turn other transistors off. This selective activation of certain transistors on the device customizes the operation of the device so that the device performs its intended function.

Integrated circuits such as programmable logic devices may contain adjustable delay circuitry that adds delays to signals such as clock signals. Examples of delay circuitry include phase-locked loop circuits with variable output delays and input-output blocks that contain programmable delay chains. After an integrated circuit containing delay circuitry has been designed and fabricated, it may be desirable to test the functions of the delay circuitry to ensure that the delay circuitry is providing the correct amount of delay time.

Traditional methods for testing delay circuitry on a programmable logic device may include routing signals to an external output, and using external test equipment to measure the delay time. Delay fault testing using test patterns generated by external automatic test pattern generation tools is also possible. However, these methods may be costly and may not have the precision to measure very small delays on the order of picoseconds.

It would be desirable to provide test circuitry for testing delays that is precise and cost-efficient to implement.

SUMMARY

In accordance with the present invention, delay test circuitry is provided for testing a delay generated by a circuit under test. Delay test circuitry and the circuit under test may be located on an integrated circuit such as a programmable logic device.

Delay test circuitry may be hardwired into the integrated circuit or may be soft (programmed) if the integrated circuit is a programmable logic device. Delay test circuitry may contain pulse generating logic circuitry and pulse processing circuitry.

Pulse generating logic circuitry may be provided that uses the circuit under test and logic gate to output a signal to pulse processing circuitry that has a pulse width equal to the delay time of the circuit under test.

Pulse processing circuitry may be provided that includes sampling logic circuitry and error capturing circuitry. Sampling logic circuitry may have a programmable load with an associated programmable time constant, and may output a logic value that switches values when the pulse width of the signal is greater than the time constant. Error capturing circuitry may output an error when the logic value switches values.

The delay test circuitry may require minimal integrated circuit resources, and may be implemented on an integrated circuit to test delay times before the integrated circuit is put into use by an end user.

DETAILED DESCRIPTION

The present invention relates to delay test circuitry for testing a delay time associated with a circuit under test. The delay test circuitry may be incorporated into any suitable integrated circuit, such as a microprocessor, a digital signal processor, an application specific integrated circuit (ASIC), a memory chip, an audio or video integrated circuit, a communications circuit, etc. With one suitable arrangement, which is sometimes described herein as an example, the delay test circuitry may be located on an integrated circuit such as a programmable logic device.

Figure 1:
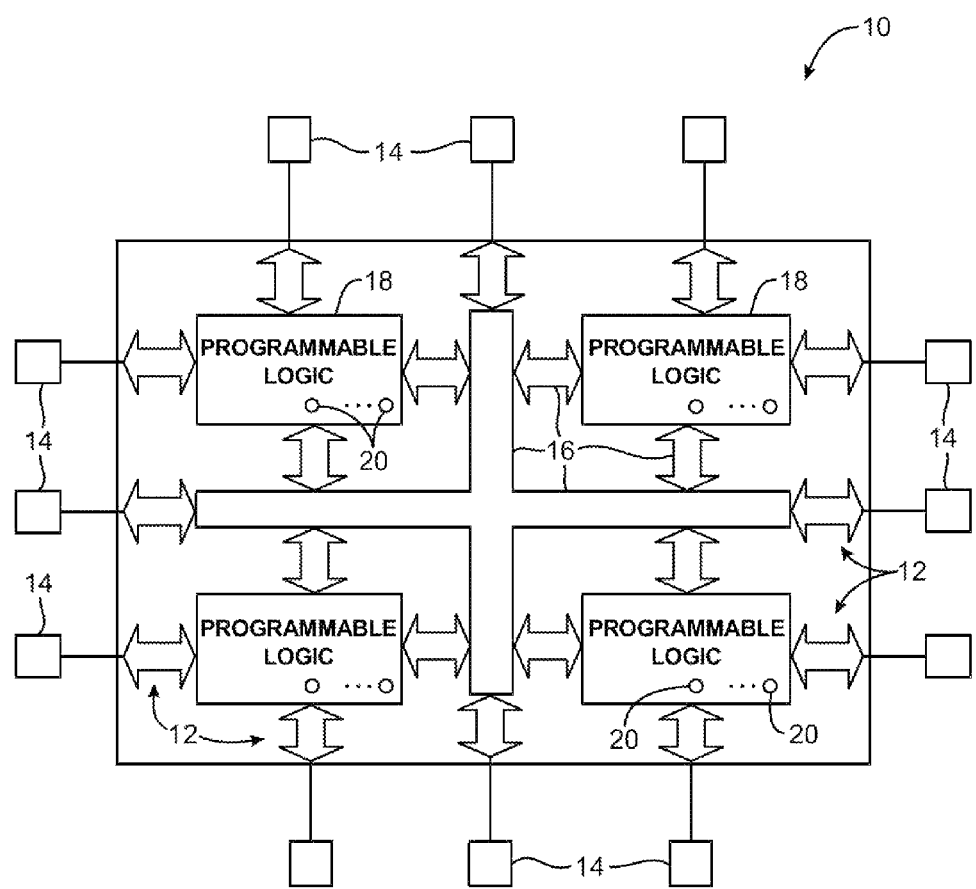
FIG. 1 is a diagram of a programmable logic device in accordance with an embodiment of the present invention.

An illustrative programmable logic device 10 is shown in FIG. 1. Programmable logic device 10 has input-output circuitry 12 for driving signals off of device 10 and for receiving signals from other devices via input-output pins 14. Interconnection resources 16, also known as interconnects 16, such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 10.

Programmable logic device 10 may contain programmable elements 20 such as random-access memory cells and non-volatile elements such as polysilicon fuses. Programmable elements 20 (e.g., volatile elements such as random-access memory cells) can be loaded with configuration data (also called programming data) using pins 14 and input-output circuitry 12. The programmable elements may each provide a corresponding static control output signal that controls the state of an associated logic component in programmable logic 18. The programmable element output signals are typically used to control the gates of metal-oxide-semiconductor (MOS) transistors. Most of these transistors are generally n-channel metal-oxide-semiconductor (NMOS) pass transistors in programmable components such as multiplexers, look-up tables, logic arrays, AND, OR, NAND, and NOR logic gates, etc. When a programmable element output is high, the pass transistor controlled by that programmable element is turned on and passes logic signals from its input to its output. When the programmable element output is low, the pass transistor is turned off and does not pass logic signals.

The programmable elements may be loaded from any suitable source. In a typical arrangement in which device 10 is used in a system, the programmable elements are loaded from an external erasable-programmable read-only memory and control chip called a configuration device via pins 14 and input-output circuitry 12. During testing, device 10 or a test chip version of device 10 may be loaded with configuration data by testing equipment.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
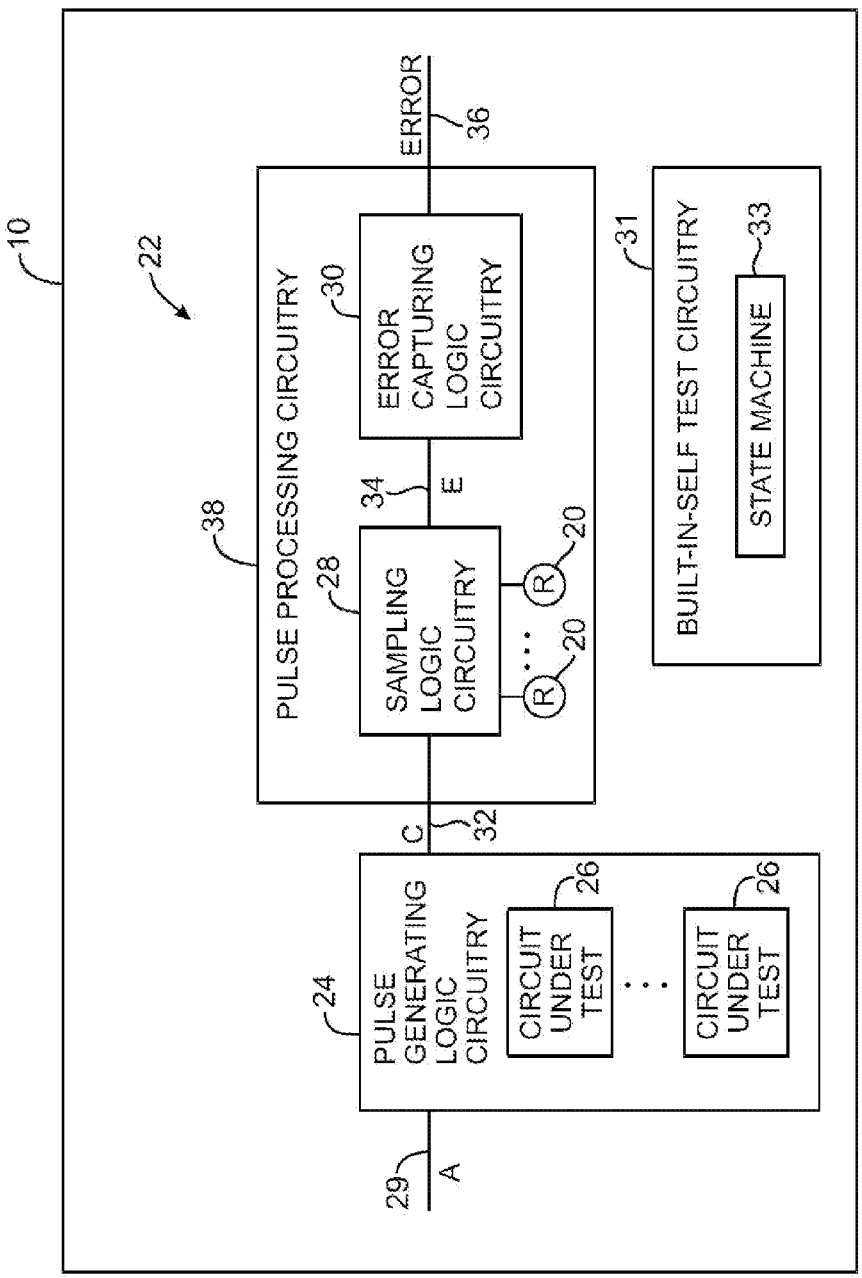
FIG. 2 is a diagram of an integrated circuit with delay test circuitry and optional built in self test circuitry in accordance with an embodiment of the present invention.

As shown in FIG. 2, delay test circuitry 22 may be located on an integrated circuit such as integrated circuit 10. Delay test circuitry 22 may be used to test the delay time of one or more circuits under test 26. Circuits under test 26 may be any fixed or adjustable circuitry on integrated circuit 10 that delays a signal. For example, circuits under test 26 may have associated delay times that can be adjusted by loading circuits 26 with appropriate configuration data. Circuits under test 26 may be circuitry that delays signals passing through input-output blocks. Circuits under test 26 may also provide adjustable (e.g., programmable) phase delays to clock signals. The amount of delay time that circuit under test 26 provides to a signal may be known as delay time Tcut.

Delay test circuitry 22 may have pulse generating logic circuitry 24 connected to circuits under test 26. Pulse generating logic circuitry 24 may receive a reference signal A on input path 29. Reference signal A may be a clock signal or any suitable signal that may be received and delayed by circuit under test 26. Pulse generating logic circuitry 24 may produce an output signal C on a path 32. Signal C may have a pulse that has a pulse width of time Tcut.

Pulse processing circuitry 38 may have sampling logic circuitry 28 and error capturing logic circuitry 30. Sampling logic circuitry 28 may receive signal C on path 32. Sampling logic circuitry 28 may be programmed by programmable elements 20 to have an associated time constant Tmin. Sampling logic circuitry 28 may provide a signal E on path 34 that has a constant logic value (i.e., logic high or logic low) unless the delay time Tcut is greater than time constant Tmin. Signal E may switch logic values when delay time Tcut is greater than Tmin. Error capturing logic circuitry may receive signal E on path 34 and may supply a corresponding error signal ERROR on path 36 that is indicative of whether the signal E has switched logic values. The presence of an error signal ERROR of a particular value (e.g., a logic high) on path 36 indicates that the delay time Tcut is greater than the time constant Tmin of sampling logic circuitry 28.

If integrated circuit 10 is a programmable logic device, integrated circuit 10 may include optional configurable built in self test (BIST) circuitry 31 for testing on-chip circuitry. The built in self test circuitry 31 may perform tests such as at-speed tests to determine whether circuitry is operating properly. If an error is detected, the programmable logic device can be repaired by switching redundant circuitry into use (if available) or the programmable logic device can be discarded. BIST circuitry 31 may have a state machine 33 that may be used to perform selected tests on circuit 10 based on the loaded test control settings. BIST circuitry 31 and state machine 33 may be used with delay test circuitry 22 to test the delay times associated with circuits under test 26.

The configurable built in self test circuitry may be implemented by providing a block of hardwired built in self test circuitry on device 10. During testing, the hardwired built in self test circuitry may be used to test device 10. With another suitable approach, the configurable built in self test circuitry may be implemented using programmable logic resources on device 10. This type of built in self test circuitry, which is sometimes referred to as soft built in self test circuitry or a soft BIST, temporarily consumes programmable logic resources. After testing is complete, the programmable logic resources can be used to implement a desired logic design for a user (i.e., to implement user logic). Soft BIST arrangements can be advantageous when it is desired to minimize the amount of hardwired circuitry on the device 10 that is dedicated to implementing BIST functions. Hardwired BIST arrangements can be advantageous in situations in which it is desirable to avoid the programming time associated with configuring a soft BIST.

Figure 3:
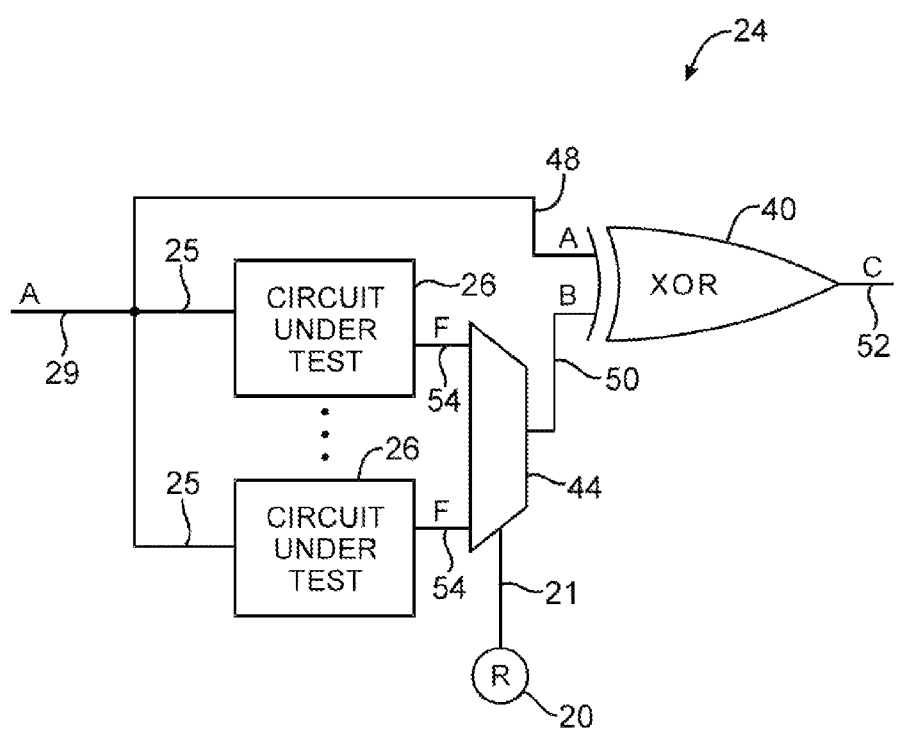
FIG. 3 is a diagram of pulse generating logic circuitry in accordance with an embodiment of the present invention.

Pulse generating logic circuitry 24 may have a configuration of the type shown in FIG. 3. Circuitry 24 may receive reference signal A on input 29. Reference signal A may be provided on paths 25 to one or more circuits under test 26. Each circuit under test 26 may output a signal F on a path 54. Signal F may be delayed with respect to signal A by a delay time Tcut. Paths 25 and 26 connecting to circuits under test 26 may be hardwired on integrated circuit 10 or they may be programmed interconnects 16 (see, e.g., FIG. 1).

Circuit under test 26 may be any suitable circuit that receives a signal and outputs a signal that is delayed with respect to the received signal. For example, circuits under test 26 may provide a phase delay to a clock signal or may be programmable delay chains in input-output circuitry 12 of FIG. 1. Circuits under test 26 may be formed at any suitable location on integrated circuit 10. Circuits under test 26 may, for example, be located adjacent to portions of pulse generating logic circuitry 24 such as multiplexer 44 and logic XOR gate 40, or may be located in other areas of integrated circuit 10. If circuits under test 26 are adjacent to the components of pulse generating logic circuitry 24, there may be an advantage of increased accuracy or precision in testing circuits under test 26. If circuits under test 26 are located in other areas of integrated circuit 10, many circuits under test 26 may be tested by one implementation of pulse generating circuitry 24, thus conserving circuit resources.

The signals F that are output by circuits under test 26 may be provided on paths 54 to a multiplexer 44. Multiplexer 44 may receive a control signal on a path 21 such as a static control signal from a memory element 20 or a dynamic control signal from a BIST circuit. The control signals may control which of the circuits under test 26 is being tested at a given time. The signal F originating from the circuit under test 26 that is being tested may be output by multiplexer 44 on path 50 as signal B. Logic XOR gate 40 may receive reference signal A on path 48. Path 48 may be a bypass path that is connected to input paths 25 of circuits under test 26. Logic XOR gate 40 may receive signal B on path 50. Logic XOR gate 40 applies a logic XOR function to its input signals A and B and supplies a resulting signal C on output 52. Signal C has a logic high value when signal A is high and signal B is low. Signal C is also high when signal A is low and signal B is high. As a result, signal C forms a pulse that has a pulse width that that is equal to the delay time Tcut of the circuit under test 26.

Figure 4:
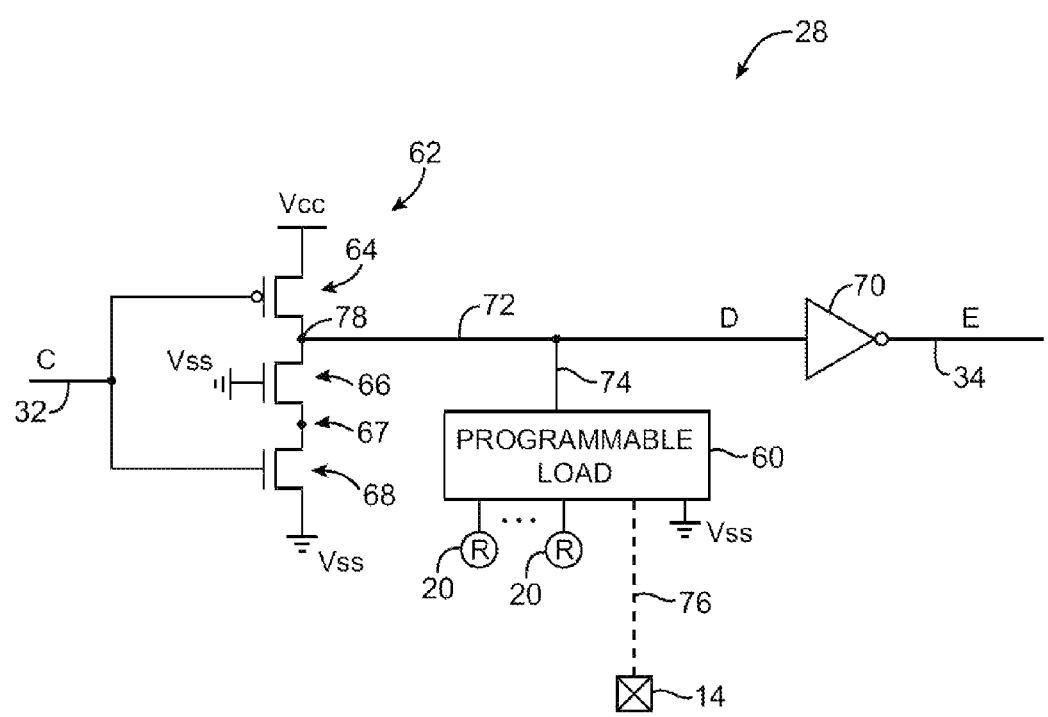
FIG. 4 is a diagram of sampling logic circuitry in accordance with an embodiment of the present invention.

Sampling logic circuitry 28 of FIG. 2 may have a configuration of the type shown in FIG. 4. As shown in FIG. 4, sampling logic circuitry 28 may receive signal C on input 32. Signal C may be applied to the gates of PMOS transistor 64 and NMOS transistor 68 of an inverter 62. PMOS transistor 64 may be connected to a positive power supply voltage Vcc and NMOS transistor 68 may be connected to a ground power supply voltage Vss. Inverter 62 may have an optional NMOS transistor 66 connected between PMOS transistor 64 and NMOS transistor 68 so that inverter 62 forms a dynamic inverter circuit. The gate of NMOS transistor 66 may be connected to a ground power supply voltage Vss. In the absence of optional NMOS transistor 66, nodes 78 and 67 may be connected together. The output of inverter 62, signal D, is provided on node 78 and path 72.

An adjustable load such as programmable load 60 may be connected to path 72 by a path 74. Programmable load 60 may be connected to ground power supply voltage Vss. Programmable load 60 may be programmed by control signals received from memory elements 20. Load 60 may also be adjusted by dynamic control signals. For example, programmable load 60 may receive external control signals from input-output pins 14 that are routed to programmable load 60 on a path 76. Path 76 may be a path through programmable interconnects 16 of FIG. 1. Programmable load 60 may also receive control signals from optional built-in-self-test circuitry 31 of FIG. 2. Inverter 70 may receive signal D on path 72 and output signal E on path 34.

Inverter 62 may be precharged so that PMOS transistor 64 is on, NMOS transistor 68 is off, path 32 is low, and signal D on node 78 is high. The rising edge of a pulse in signal C will then turn off PMOS transistor 64 and turn on NMOS transistor 68, connecting node 67 to ground voltage Vss. NMOS transistor 66 is always turned off as its gate is connected to ground voltage Vss, but leakage current through NMOS transistor 66 will bring node 78 and path 72 to the value of node 67 (i.e., to ground voltage Vss). The presence of programmable load 60 may slow the rate that node 78 and path 72 are brought to ground voltage. There may be a time constant Tmin that characterizes the time after which node 78 and path 72 are brought to ground voltage after a rising edge of signal C. Time constant Tmin may be customized by customizing NMOS transistor 66 or adjusting programmable load 60. A smaller and weaker NMOS transistor 66, or no NMOS transistor 66, would tend to increase time constant Tmin, and a larger and stronger NMOS transistor 66 would tend to decrease time constant Tmin. Programmable load 60 may be programmed to have a larger load that would increase time constant Tmin or a smaller load (or no load) that would decrease time constant Tmin.

If signal C has a pulse width Tcut that is less than time constant Tmin, then there would not be enough time after the rising edge of signal C for node 78 and path 72 to be brought to ground voltage before the falling edge of signal C is received on inverter 62. The high value of node 78 and path 72 may fall slightly after the rising edge of C is received on inverter 62, but would remain high enough to be considered a logic high. Signals D and E would therefore remain at their initial values of logic high for signal D and logic low for signal E. If, on the other hand, signal C has a pulse width Tcut that is greater than Tmin, the state of signal E would flip. By adjusting Tmin, Tcut can be measured.

Programmable load 60 may have any suitable form that provides a load on path 72. Programmable load 60 may have the configuration shown in FIG. 5. Programmable load 60 may have one or more programmable resistor-capacitor circuits 88. Each resistor-capacitor circuit 88 may be connected to path 72 by a path 74 and may be connected to a ground power supply voltage such as voltage Vss on terminal 90. Each circuit 88 may have a resistor 82 that is connected in series with a capacitor 84. Each resistor-capacitor circuit 88 may have a transistor 80 connected to path 74. A control signal such as a control signal from memory element 20 on path 89 or a dynamic control signal may be applied to the gate of transistor 80.

There may be any suitable number of programmable resistor-capacitor circuits 88 as indicated by dots 86. At a given time, any number of transistors 80 may be turned on, connecting their respective resistor-capacitor circuits 88 to path 72 on which signal D is carried. If desired, a relatively large number of transistors 80 may be turned on to increase the capacitive load on path 72. To decrease the load on path 72, a lower number of transistors 80 may be turned on, or transistors 80 may all be turned off. Programmable load 60 may be programmed to have a load that, together with a load provided by NMOS transistor 66 in FIG. 4, provides a desired time constant Tmin for sampling logic circuitry 28 of FIG. 5.

Figure 6:
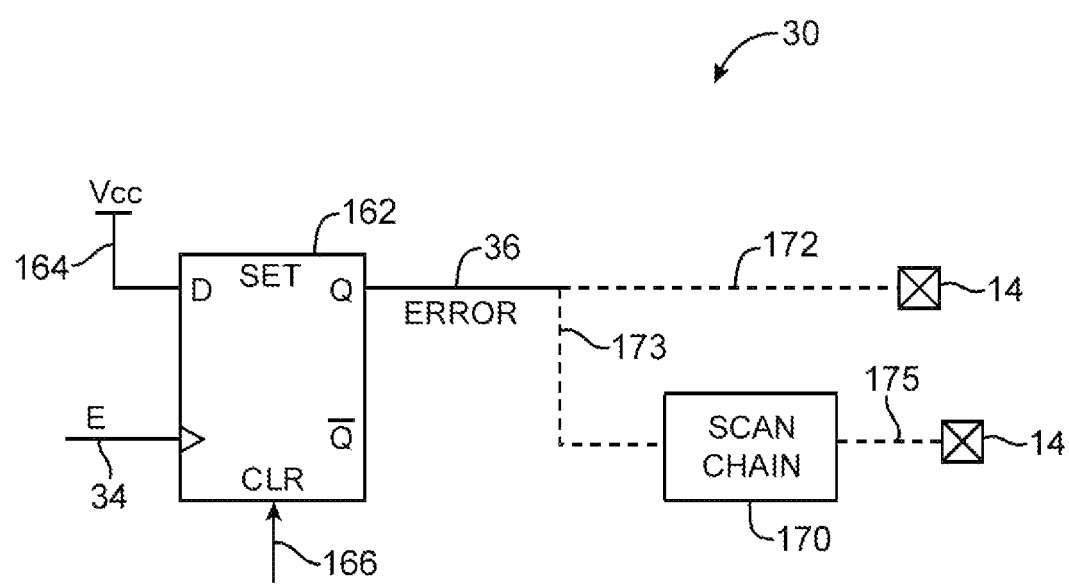
FIG. 6 is a diagram of error capturing logic circuitry in accordance with an embodiment of the present invention.

Error capturing logic circuitry 30 may have a configuration of the type shown in FIG. 6. Error capturing logic circuitry 30 may have a register such as flip-flop 162 that receives a positive power supply voltage Vcc on its input D from path 164. Flip-flop 162 may receive clock signal E on clock input path 34 from sampling logic circuitry 28 (see, e.g., FIGS. 2 and 4). A clear signal CLR may be provided on path 166. The clear signal CLR may be provided by external testing equipment and supplied to error capturing circuitry 30 via input-output pins 14 on integrated circuit 10 (see, e.g., FIG. 1). Path 166 may be path through programmable interconnects 16 (see, e.g., FIG. 1). An error signal ERROR may be provided on path 36. Error signal ERROR may be routed through a path 172 through programmable interconnects 16 (see, e.g., FIG. 1) to input-output pins 14. If desired, error signal ERROR may be sent on a path 173 to a scan chain 170 that may be connected by a path 175 to input-output pins 14. Paths 172, 173, and 175 may be hardwired or they may be implemented using paths through programmable interconnects 16 of FIG. 1.

Error capturing logic circuitry 30 may be initialized by providing clear signal CLR on path 166 to set output Q on path 32 to a logic low. Signal E on path 34 may be initially at a logic low. If signal E switches from logic low to logic high, positive voltage Vcc on input D will be passed to output Q and path 36, creating a high error signal ERROR. Error signal ERROR may be output on input-output pins 14, or may be stored in scan chain 170 to be output on input-output pins 14.

Signal E on path 34, which is provided by sampling logic circuitry 28 of FIG. 4, switches from logic low to logic high only when the time constant Tmin of sampling logic circuitry 28 is less than the delay time Tcut of circuit under test 26 (see, e.g., FIG. 3). The presence of a high error signal on path 36 therefore indicates that the state of ERROR has flipped from "0" to "1" and that the time delay Tcut of circuit under test 26 is greater than the customizable time constant Tmin of sampling logic circuitry 28.

Figure 7:
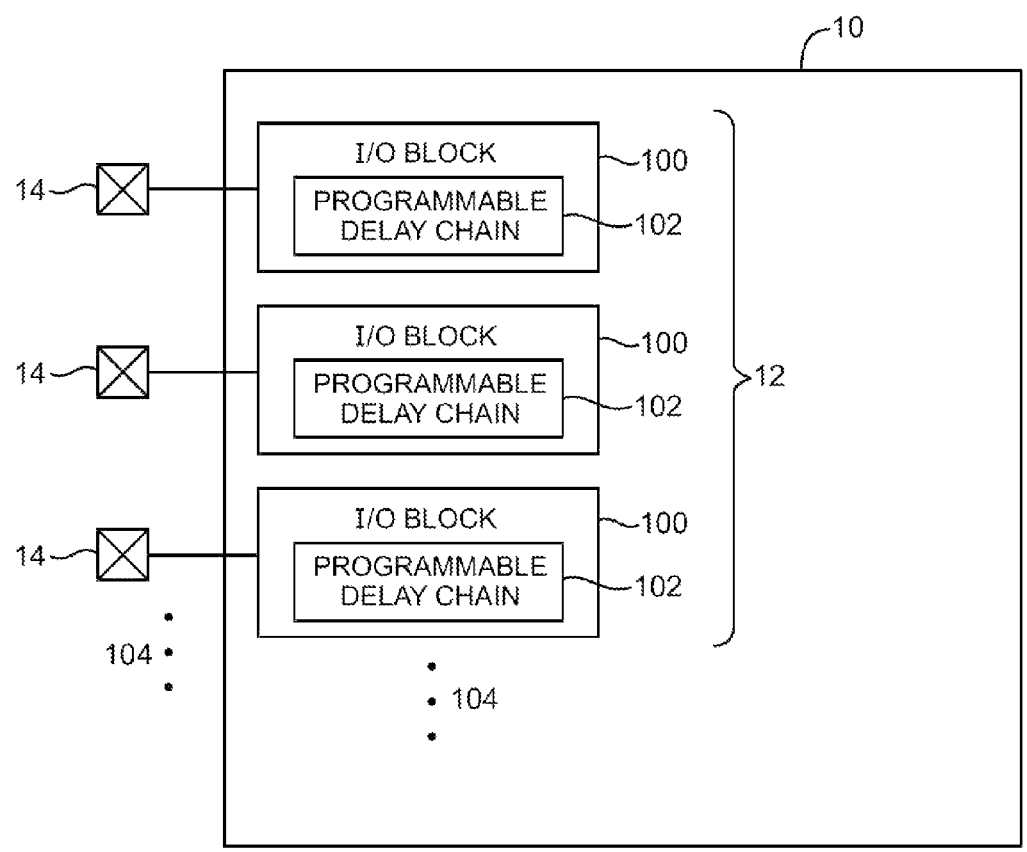
FIG. 7 is a diagram of input-output blocks on an integrated circuit in accordance with an embodiment of the present invention.

Delay test circuitry 22 may be used to test any suitable circuits under test on integrated circuits such as programmable logic device 10 in FIG. 1. For example, delay test circuitry 22 may be used to test delay circuitry in input-output circuitry 12 of FIG. 1. Input-output circuitry 12 may have a configuration of the type shown in FIG. 7. As shown in FIG. 7, input-output circuitry 12 may have input-output blocks 100. Each input-output block 100 may be connected to an input-output pin 14. There may be any suitable number of input-output blocks 100 and input-output pins 14 as shown by dots 104. Each input-output block 100 may have one or more programmable delay chains 102 that may be used for synchronizing input and output signals from input-output pins 14.

Figure 8:
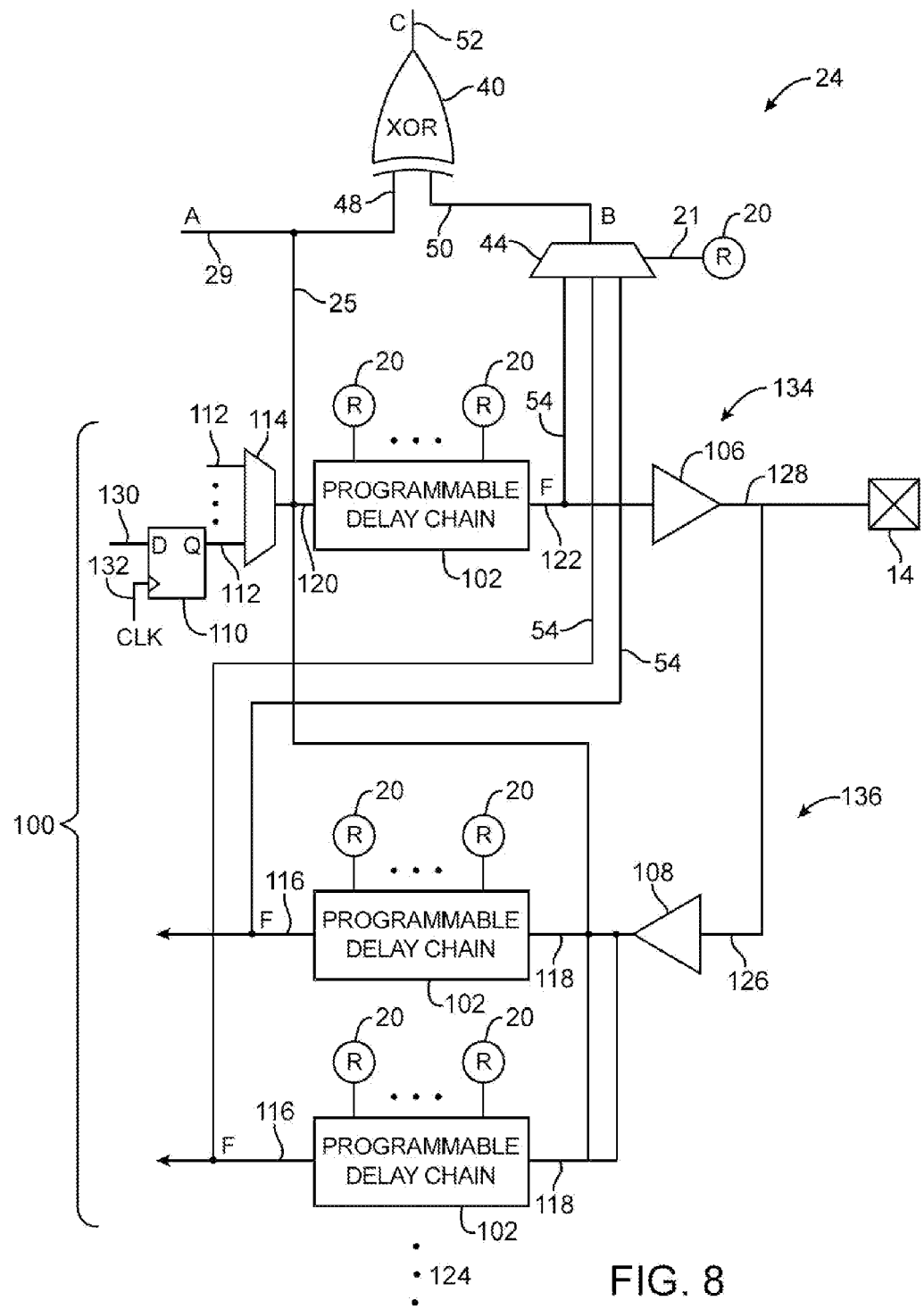
FIG. 8 is a diagram of an input-output block containing programmable delay chains in accordance with an embodiment of the present invention.

Delay test circuitry 22 may be used to test the delays provided by programmable delay chains 102, as shown in FIG. 8. FIG. 8 is a diagram showing pulse generating logic circuitry 24 in a configuration for testing programmable delay chains 102 in an input-output block 100. Input-output block 100 has output circuitry 134. Output circuitry 134 may output signals stored in a register such as register 110. Register 110 may have input path 130 and path 132 on which a clock signal CLK is received. Register 110 may output a signal on path 112 that is connected to multiplexer 114. Multiplexer 114 may have many input paths 112 that receive signals from registers 110 or other devices. Multiplexer 114 may supply an output signal on a path 120 that is connected to programmable delay chain 102. Programmable delay chain 102 may be controlled by control signals from memory elements 20. Programmable delay chain 102 may output a signal F on a path 122 that is connected to a buffer 106. Buffer 106 may be connected by a path 128 to input-output pin 14.

Input circuitry 136 may have a buffer 108 that is connected to input-output pin 14 by a path 126. Buffer 108 may be connected by path 118 to one or more programmable delay chains 102. There may be any number of programmable delay chains 102 in the input path as indicated by the dots 124. Each programmable delay chain 102 may be controlled by control signals such as control signals from memory elements 20 or dynamic control signals. Each programmable delay chain 102 in input circuitry 136 may have an output path 116 leading to other devices in integrated circuit 10.

Delay test circuitry 22 (see, e.g., FIG. 2) may be used to test programmable delay chains 102 in input-output block 100 to evaluate whether programmable delay chains 102 are providing appropriate delay times. In FIG. 8, pulse generating logic circuitry 24 is shown with programmable delay chains 102 serving as circuits under test 26 (see, e.g., FIGS. 2 and 3). Reference signal A may be provided on path 29. Path 29 may be connected by path 25 to inputs of programmable delay chains 102. Multiplexer 44 may have input paths 54 that are connected to the outputs of programmable delay chains 102. Output signals from programmable delay chains 102 may be known as signals F. Paths 25 and 54 may be hardwired or may be paths through programmable interconnects 16 (see, e.g., FIG. 1). Multiplexer 44 may receive a control signal on path 21 such as a control signal from memory element 20 or a dynamic control signal. Logic XOR gate 40 may receive reference signal A on path 48 and signal B on path 50 from multiplexer 44. Logic XOR gate may output signal C on path 52.

In FIG. 8, pulse generating logic circuitry 24 is shown as being connected to both input circuitry 134 and output circuitry 136. If desired, pulse generating logic circuitry 24 may be connected to only input circuitry 134 or only output circuitry 136. If desired, in addition to input circuitry 134 and output circuitry 136, pulse generating logic circuitry 24 may also be connected to other circuits under test 26 on integrated circuit 10.

Figure 9:
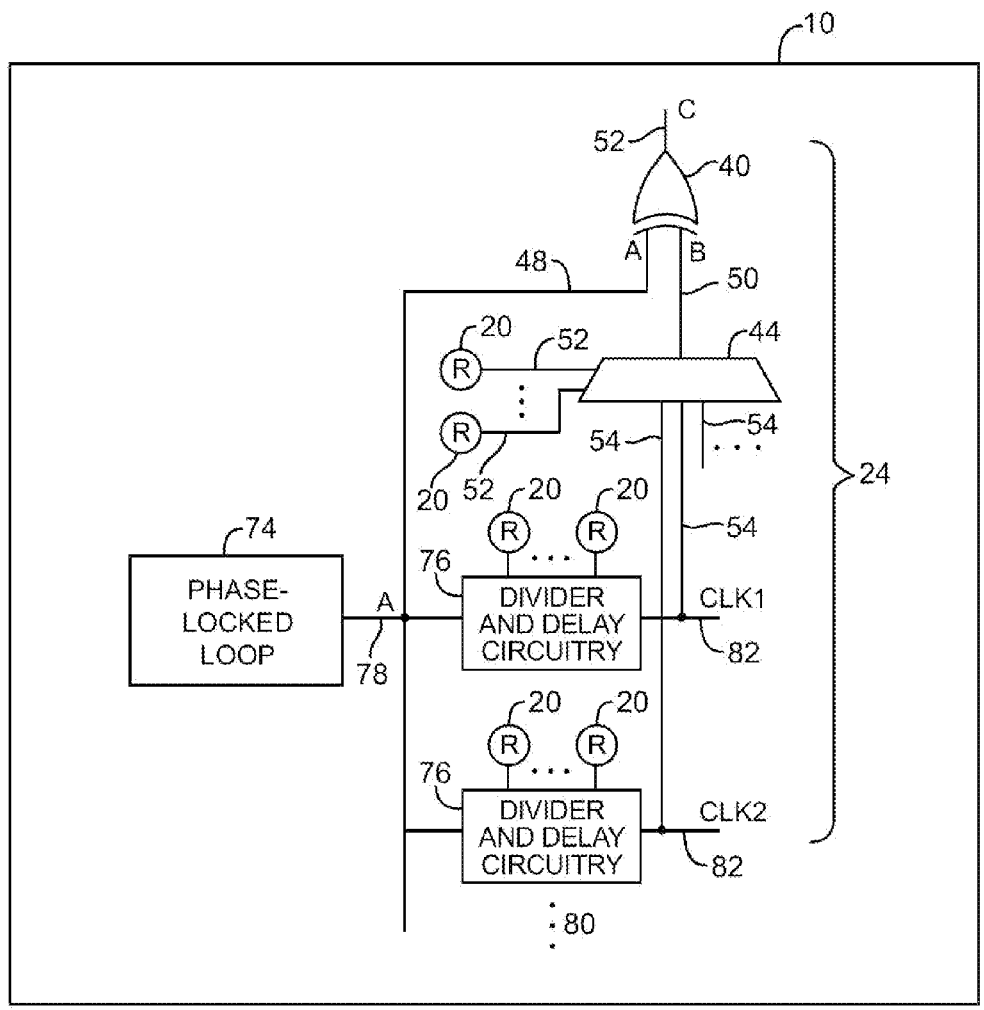
FIG. 9 is a diagram of a phase-locked loop with multiple outputs with adjustable delays in accordance with an embodiment of the present invention.

Delay test circuitry may be used to test circuits that are connected to phase-locked loops. FIG. 9 shows how integrated circuit 10 may contain phase-locked loop 74. Phase-locked loop 74 may be used to provide clock signals to integrated circuit 10. As a phase-locked loop 74 may occupy a significant amount of space on an integrated circuit 10, phase-locked loop 74 may be used to output a common clock signal A on a path such as path 78 to circuitry such as divider and delay circuits 76. The phase-locked signal A may be received by one or more divider and delay circuits 76. There may be any suitable number of circuits 76 as indicated by dots 80. Divider and delay circuits 76 may each modify clock signal A and may each output a different modified (frequency divided and delayed) clock signal. In this way, many clock signals may be obtained from a single implementation of a phase-locked loop 74. Divider and delay circuit 76 may be controlled by control signals from memory elements 20. Circuitry 76 may contain dividers so that clock signals on outputs 82 (e.g., CLK1, CLK2, etc) may be a higher or lower multiple of clock signal A. Circuit 76 may also contain delay circuitry that may provide a phase delay between clock signal outputs (e.g., CLK1) on paths 82 and signal A.

Pulse generating logic circuitry 24 is shown in FIG. 9 with divider and delay circuit 76 serving as circuits under test 26 (see, e.g., FIG. 3). Each divider and delay circuit 76 may have an output 82 connected to a path 54 that leads to an input of multiplexer 44. Multiplexer 44 may be controlled by control signals from memory elements 20 on paths 52. Logic XOR gate 40 may receive signal A on a bypass path 48. Logic XOR gate 40 may receive delayed clock signal B on path 50 from multiplexer 44. Logic XOR gate 40 may output pulse signal C of width Tcut on path 52.

Delay test circuitry may be used to test phase delays provided by divider and delay circuit 76. A circuit 76 may, for example, be designed to provide a phase delay of 180 degrees between signal A and an output signal (e.g., CLK1). Testing with delay test circuitry may determine whether the actual phase delay of the fabricated circuit is 180 degrees or a value that is slightly different such as 181 degrees.

Figure 10A:
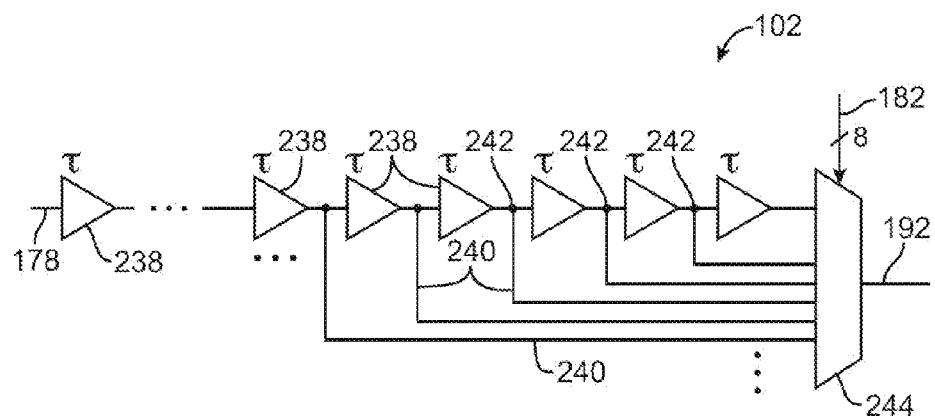
FIG. 10A is a circuit diagram showing a programmable delay chain in accordance with an embodiment of the present invention.
Figure 10B:
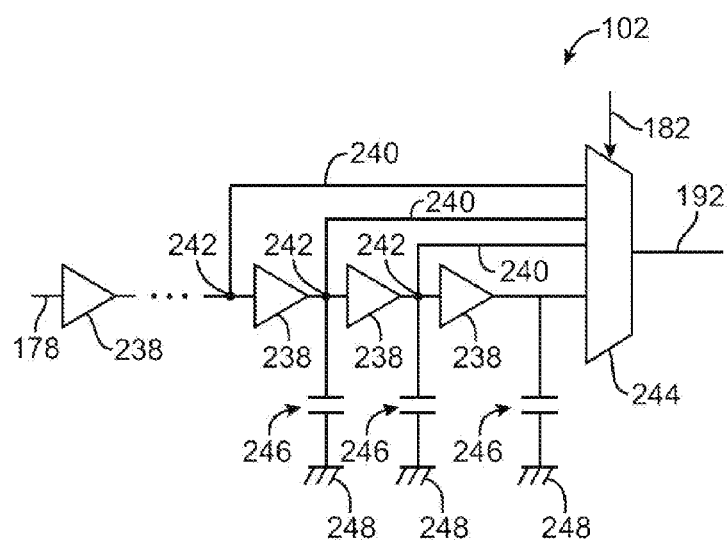
FIG. 10B is a circuit diagram showing a programmable delay chain in which delay elements have associated capacitors in accordance with an embodiment of the present invention.

Illustrative programmable delay chains 102 of the type that may be used in programmable delay chains 102 of FIGS. 7 and 8 and in divider and delay circuitry 76 of FIG. 9 are shown in FIGS. 10A and 10B. Programmable delay chain 102 of FIG. 10A has an input 178 and an output 192. A chain of buffers 238 is used to create a controllable amount of delay time for the signals passing between input 178 and output 192. Multiplexer 244 has multiple inputs and a single output. Paths 240 are connected to tap points 242 that lie between respective pairs of buffers 238. Each buffer has an associated delay time τ, so by controlling the location of the tap point 238, the delay time of the circuit 180 can be adjusted. If, for example, multiplexer 244 is adjusted so that there are M buffers in the path between input 178 and output 192, the programmable delay chain 102 will generate a delay time of Mτ.

A control signal is applied to multiplexer 244 via control input 182. The control signal controls which of the multiplexer inputs is electrically connected to its output. The control signal may be provided in any suitable format. In the example of FIG. 10A, the control signal is provided in the form of an eight-bit signal, providing eight bits of accuracy for adjusting the delay time of the programmable delay chain 102. The control signals may originate from programmable elements such as programmable elements 20 (see, e.g., FIG. 1) or dynamic control circuitry.

If additional delay time is needed, illustrative programmable delay chains 102 of the type shown FIG. 10B may be used. Programmable delay chain 102 of FIG. 10B has an input 178 and an output 192. A chain of buffers 238 is used to create a controllable amount of delay time for the signals passing between input 178 and output 192. Multiplexer 244 has multiple inputs and a single output. As with circuit 102 of FIG. 10A, paths 240 in circuit 102 of FIG. 10B are connected to tap points 242 that lie between respective pairs of buffers 238. To provide additional delay for each stage, capacitors 246 may be connected between tap points 242 and a ground power supply (e.g. Vss) at ground terminals 248. A control signal is applied to multiplexer 244 via control input 182. The control signal determines which of the multiplexer inputs is electrically connected to its output. The control signal may be provided in any suitable format. The control signals may originate from programmable elements 20 (see, e.g., FIG. 1) or dynamic control circuitry.

Figure 11:
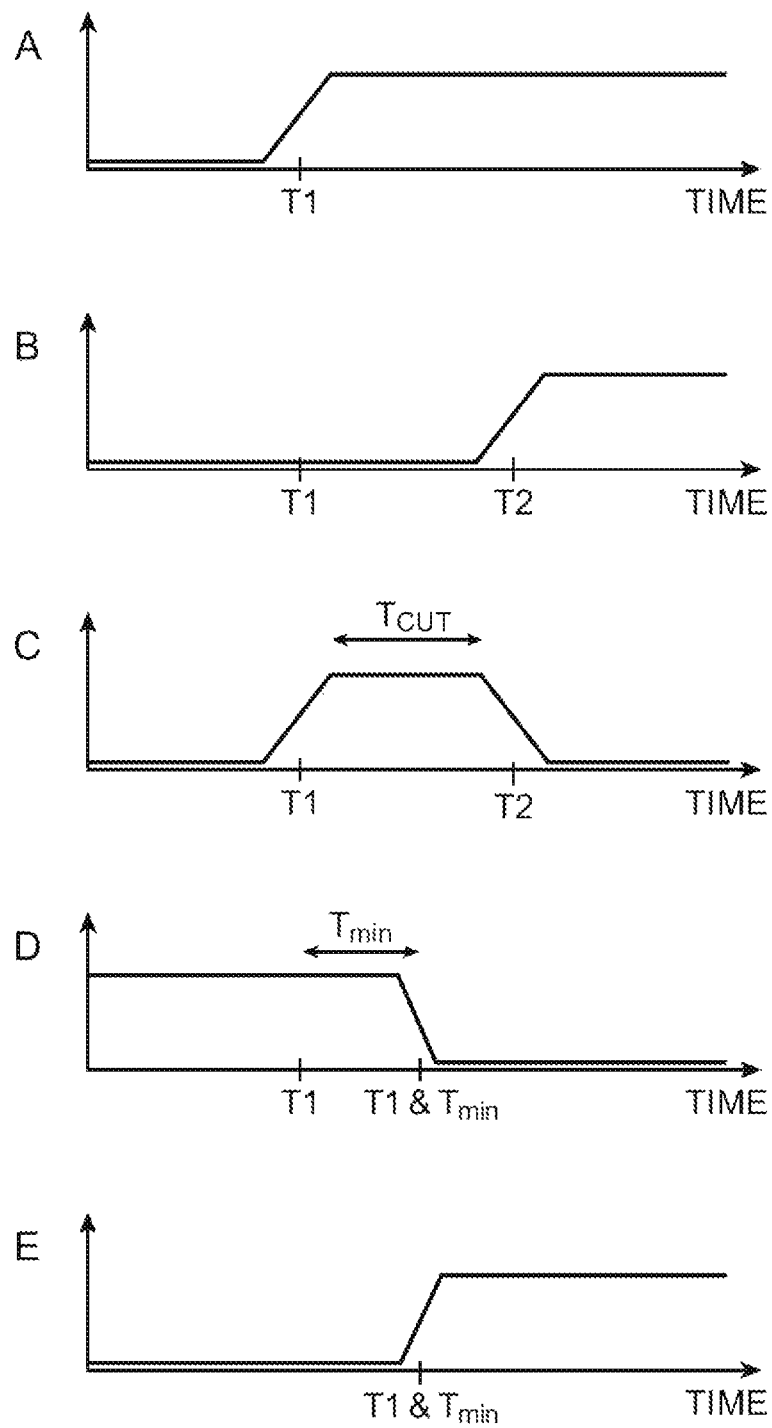
FIG. 11 is a diagram showing clock traces when a delay time of a circuit under test is greater than a time constant of delay test circuitry in accordance with an embodiment of the present invention.

FIG. 11 shows the response of signals A, B, C, D, and E (see, e.g., FIGS. 2-4) in a situation in which the delay time Tcut of the circuit under test is greater than the time constant Tmin of the delay test circuitry. The first trace shows reference signal A, which is provided to circuits under test 26 (see, e.g., FIG. 3). Reference signal A is also provided on an input to logic XOR gate 40 (see, e.g., FIG. 3). In the first trace of FIG. 1, reference signal A is shown switching from logic low to logic high at time T1. The second trace in FIG. 11 shows a signal B that is output from multiplexer 44 and provided as a second input to logic XOR gate 40 (see, e.g., FIG. 3). Clock signal B has passed through the circuit under test and is therefore delayed by time Tcut from that of signal A. Signal B has a rising edge at time T2, where T2=T1+Tcut. The third trace in FIG. 11 shows clock signal C, which is output from logic XOR gate 40 on path 52 (see, e.g., FIG. 3). Logic XOR gate 40 applies a logic XOR function to signals A and B. Signal C is therefore high when one and only one of signals A and B is high. Signal C therefore has a pulse width that is equal to Tcut.

Signal C is received by sampling logic circuitry 28 on path 32 (see, e.g., FIGS. 2 and 4). Signal C is applied to gates of PMOS transistor 64 and NMOS transistor 68 of inverter 62 (see, e.g., FIG. 4). Since time Tcut is greater than time Tmin (in the FIG. 11 example), sampling logic circuitry 28 (FIG. 4) will respond to the rising edge of the pulse in signal C by bringing signal D low after time Tmin has passed, as shown in the fourth trace of FIG. 11. Signal E, which is output from inverter 70 in FIG. 4, switches from low to high when signal D switches from high to low, as shown in the fifth trace of FIG. 11. A logic high error signal is therefore output on path 36 (see, e.g., FIGS. 2 and 4).

Figure 12:
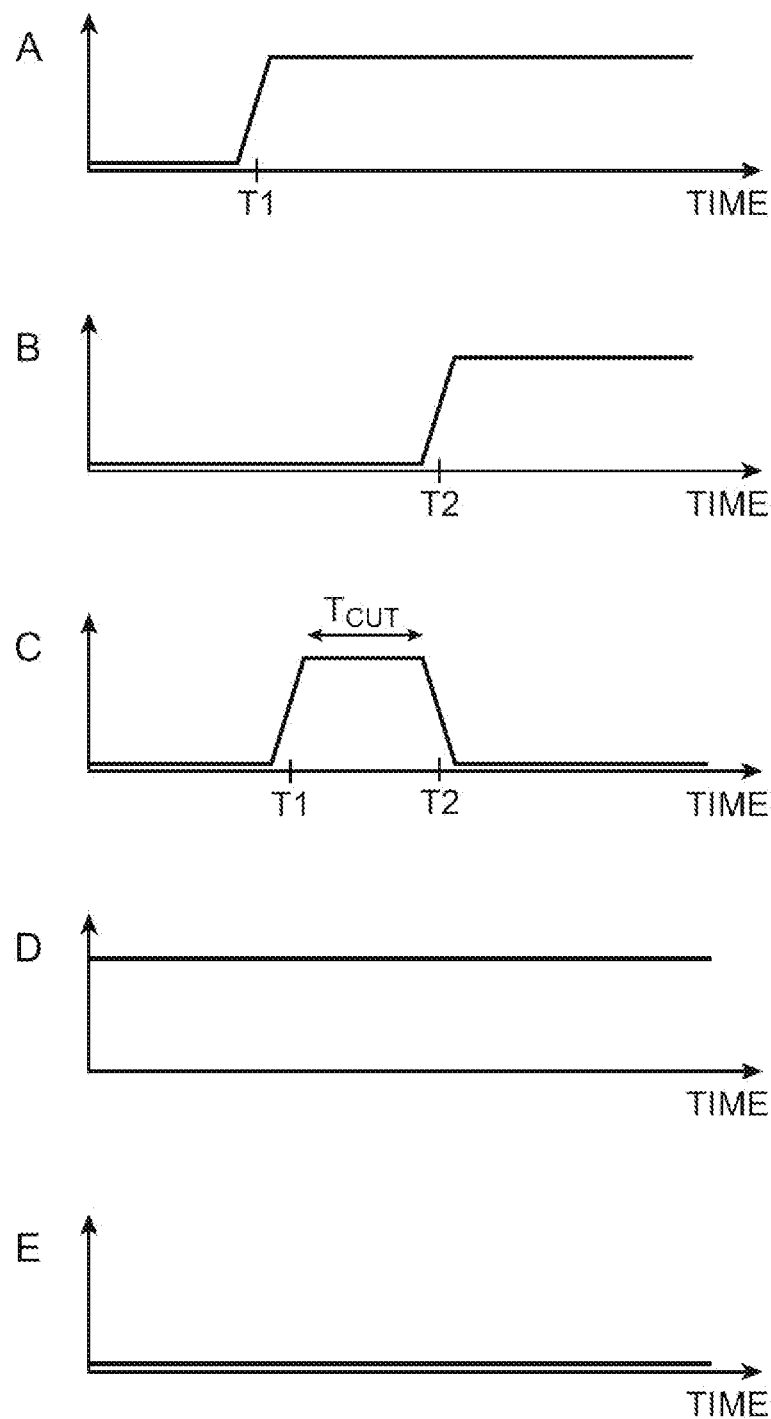
FIG. 12 is a diagram showing clock traces when a delay time of a circuit under test delay is less than a time constant of delay test circuitry in accordance with an embodiment of the present invention.

FIG. 12 shows the response of signals A, B, C, D, and E (see, e.g., FIGS. 2-4) in a situation in which the delay time Tcut is less than the time constant Tmin. Signal A is shown in the first trace switching from low to high at time T1. In the second trace of FIG. 12, signal B switches from low to high at time T2, where T2=T1+Tcut. The third trace shows clock signal C, which is output from logic XOR gate 40 (see, e.g., FIG. 3) having a pulse width Tcut=T2−T1. When signal C becomes high, NMOS transistor 68 in FIG. 4 is turned on, and node 67 is connected to ground voltage Vss. The formerly high value of signal D may drop slightly due to leakage through NMOS transistor 66 between node 67 and node 78, on which signal D is located. But because the delay time Tcut is less than the time constant Tmin, sampling logic circuitry 28 (see, e.g., FIG. 4) does not have time to fully discharge the high logic value of signal D. As a result, signal D retains its high logic value, as shown by the fourth trace in FIG. 12. Signal E in the fifth trace of FIG. 12 therefore remains at logic low. For the signals shown in FIG. 12, no logic high error signal is output by delay test circuitry 22.

As shown in FIGS. 11 and 12, delay test circuitry takes the delay time Tcut of a circuit under test and outputs an error signal indicative of an error when delay time Tcut is greater than that of a time constant Tmin and that shows no error when delay time Tcut is less than that of a time constant Tmin. The delay test circuitry therefore converts delay time value Tcut into a digital signal that may be easily read and processed by external testing equipment. This digitization of the delay time Tcut allows delay test circuitry to measure clock phase differences and small delay times on the order of picoseconds.

Delay circuitry in integrated circuit 10 such as programmable delay chains 102 in FIGS. 7, 8, 10A, and 10B and divider and delay circuitry 76 in FIG. 9 may be designed to provide a desired nominal delay time. However, after fabrication of integrated circuit 10, the delay circuitry may have an actual delay time that deviates from the desired nominal delay time due to process variations. Delay test circuitry 22 may be used to characterize the value of an actual delay time with respect to a nominal delay time.

Figure 13:
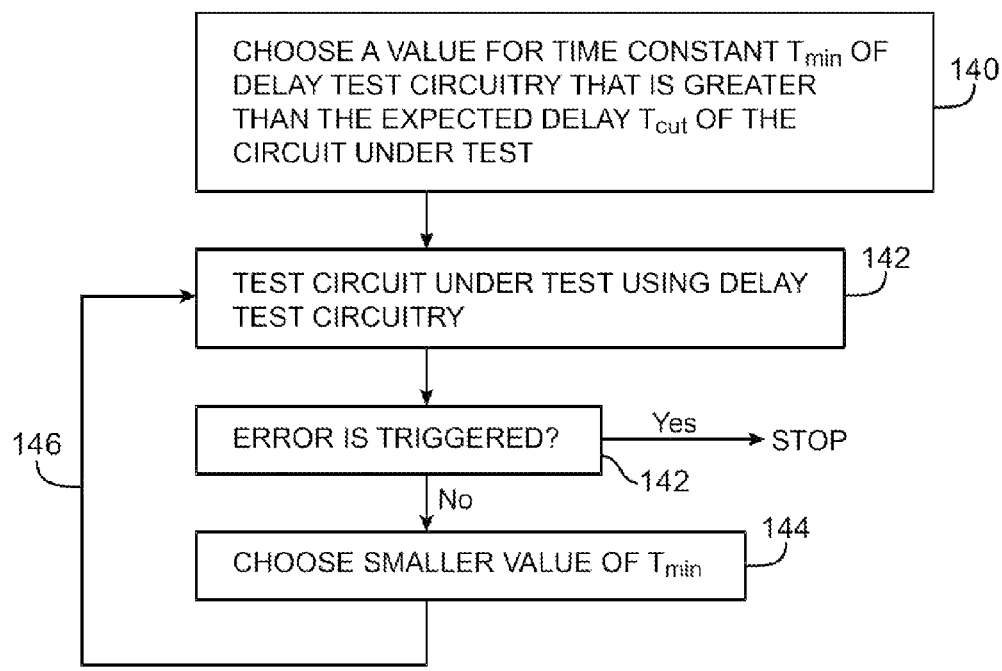
FIG. 13 is a flow chart showing a testing method for measuring a delay time of a circuit under test in accordance with an embodiment of the present invention.

For example, delay test circuitry 22 may be used to determine the delay time Tcut that is associated with a circuit under test. FIG. 13 shows how delay test circuitry 22 may be used in an iterative fashion to measure the delay time of a circuit under test. The measurement process may begin with choosing an initial value for time constant Tmin of delay test circuitry 22. The chosen value may be a value expected to be higher than the delay time Tcut of the circuit under test, as shown in step 140 of FIG. 13. The circuit under test may then be tested using this value of Tmin for delay test circuitry, as indicated by step 142 of FIG. 13. If the delay test circuitry does not output a logic high error signal (step 142 of FIG. 13), then a smaller value for time constant Tmin may be chosen for delay test circuitry 22. As indicated by arrow 146, this process may be repeated with successively smaller values for time constant Tmin until an error is triggered in step 142, indicating that the value of time constant Tmin is now less than the delay time Tcut of the circuit under test. The value of delay time Tcut will lie between the last two values of time constant Tmin that were used during testing. A process such as that shown in FIG. 13 may be used to determine the delay time Tcut of the circuit under test to any desired precision. Greater precisions may be achieved by using a smaller increment for decreasing time constant Tmin between successive testing cycles.

Figure 5:
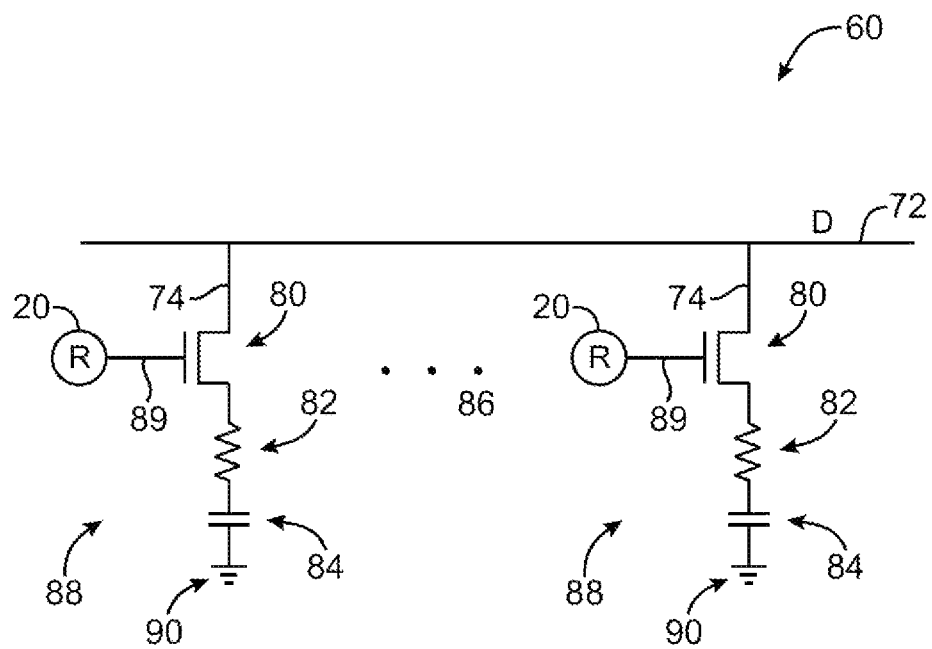
FIG. 5 is a diagram of a programmable load in accordance with an embodiment of the present invention.
Figure 14:
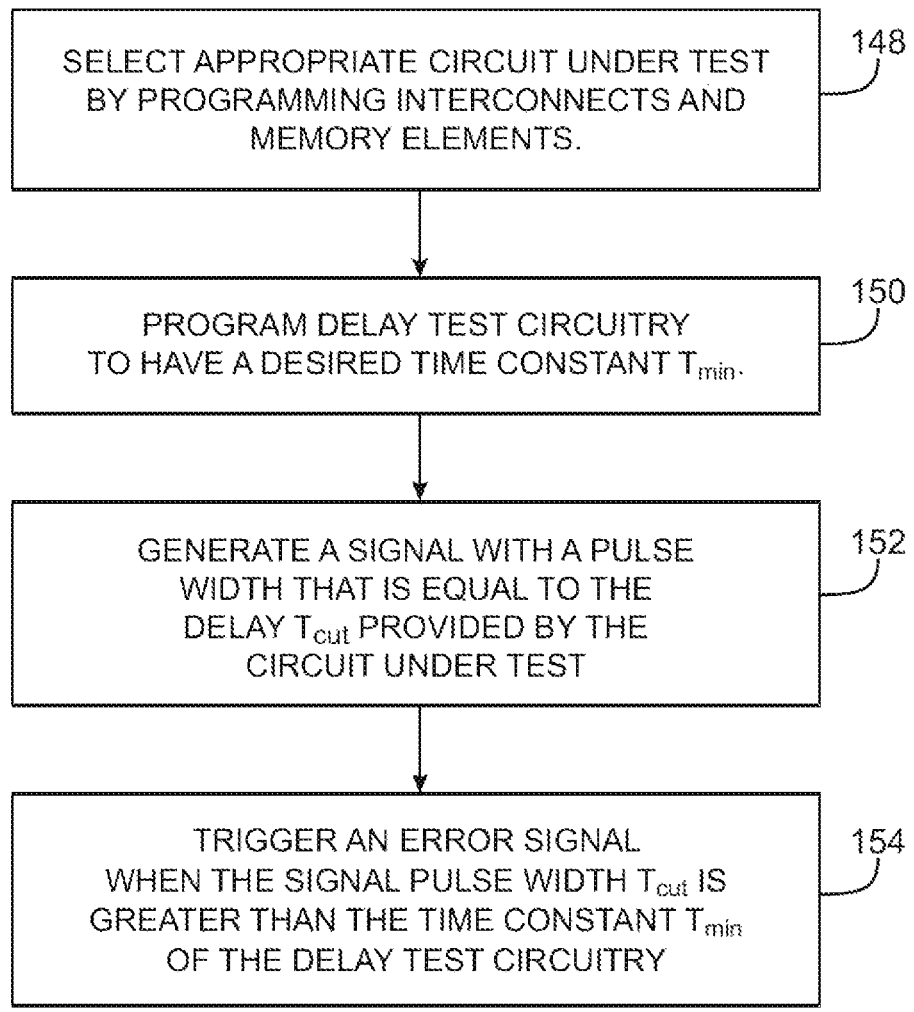
FIG. 14 is a flow chart showing how delay test circuitry may be used to measure a delay time of a circuit under test in accordance with an embodiment of the present invention.

During a testing of delay circuitry using delay test circuitry as indicated by step 142 of FIG. 13, testing may involve operations of the type shown in FIG. 14. The appropriate circuit under test may be selected, as indicated by step 148. Selecting the appropriate circuit under test may include programming paths through programmable interconnects that lead from the circuit under test to delay test circuitry and from delay test circuitry to input-output pins. Selecting the appropriate circuit under test may also include programming memory elements such as memory elements 20 in FIG. 3 to configure a particular circuit under test (e.g., to set a delay circuit to exhibit a desired Tcut value). The delay test circuitry may be programmed to have a desired time constant Tmin, as shown in step 150 of FIG. 14. Programming the time constant Tmin may include programming memory elements 20 of the programmable load 60 or otherwise adjusting load 60, as shown in FIGS. 4 and 5.

A signal may be generated that has a pulse width that is equal to the delay time Tcut of the circuit under test, as shown by step 152 of FIG. 14. An error signal may be triggered when the signal pulse width Tcut is greater than the time constant Tmin of the delay test circuitry, as indicated by step 154 of FIG. 14.

Variations of the procedure shown in FIG. 13 may also be used to find a delay time of a circuit under test. For example, an initial value for time constant Tmin for delay test circuitry may be chosen that is expected to be less than the delay time Tcut of the circuit under test. The test may be run with the expectation that an error will be triggered because the delay time Tcut is greater than the time constant Tmin. The test may be repeated with the time constant Tmin increased incrementally with each test cycle until no error is triggered by delay test circuitry. As with the approach shown in FIG. 13, this type of technique may be used to determine when delay time Tcut lies between the last two values of time constant Tmin that were used in the testing.

Testing may also be performed using alternating values of Tmin that begin with a value that is expected to be greater than Tcut and a value that is expected to be less than Tcut. Values of Tmin may be chosen for successive iterations to close in on the value for Tcut from both above and below.

Testing may also be performed as a quick survey to test whether delay times are within design margins. For example, if the circuit under test was designed to have a delay time Tcut of 10 ns with a design margin of plus or minus 2 ns, then delay test circuitry may be programmed to have a time constant Tmin of 12 ns, and a test could be run to ensure that Tmin is greater than Tcut (i.e., that an error is triggered during the test). Delay test circuitry may then be programmed to have a time constant Tmin of 8 ns, and a test could be performed to ensure that Tmin is indeed less than Tcut (i.e., that no error is triggered). Such a process could be used to quickly test delay circuitry on integrated circuit 10 to ensure that circuits under test provide delay times that are within design margins.

If process variations cause circuits under test to have delay times that are significantly different from their nominal delay times, delay test circuitry may be used to identify calibrating delay time values. For example, if a circuit under test was designed to have a delay time Tcut of 10 ns, and delay test circuitry determines the actual delay time Tcut to be 8 ns, then a 2 ns calibration factor may be used during subsequent operations with the delay circuit. Calibration operations may be performed by programming the delay circuit (as an example).

Integrated circuit 10 may have built-in-self-test (BIST) circuitry 31 (see, e.g., FIG. 2) that may be used in performing tests of circuits under test. Built-in-self-test circuitry may be used for testing any suitable circuitry on integrated circuit 10. Built-in-self-test circuitry may, for example, be used to run delay time tests using delay test circuitry. Built-in-self-test circuitry may contain a state machine that may provide control signals to delay test circuitry during the testing of delay times.

Process variations may affect the delay times of delay circuitry. For example, if devices or connections between devices are made slightly larger or smaller than anticipated, delay circuitry may have delay times that are longer or shorter than their nominal values.

Delay test circuitry may be used to test a variety of circuits under test. As shown in FIGS. 2 and 3, delay test circuitry 22 may be connected to any number of circuits under test 26. The circuits under test 26 that are connected to delay test circuitry 22 may be similar circuits, such as in the examples of FIGS. 8 and 9. In the example of FIG. 8, delay test circuitry is being used to measure programmable delay chains 102 in input-output blocks. In the example of FIG. 9, delay test circuitry is being used to measure circuitry connected to a phase-locked loop 74. If desired, a single implementation of delay test circuitry 22 may be used to test programmable delay chains 102 in input-output blocks, phased-locked loop circuitry, and other delay circuitry that may be present in integrated circuit 10. Delay test circuitry may be provided that has a wide range of different time constants Tmin to support testing of different types of delay circuits.

The programmable nature of delay test circuitry 22 may allow circuitry 22 to fulfill the demands of testing a variety of different delay test circuitries on an integrated circuit 10. The programmable aspect of programmable load 60 (see, e.g., FIGS. 4 and 5) may allow the time constant Tmin to be programmed to a different value for each run. In addition, if the delay test circuitry is located on a programmable logic device, programmable interconnects 16 (see, e.g., FIG. 1) may be used to provide paths between delay test circuitry and circuits under test, or between delay test circuitry and input-output pins (see, e.g., FIG. 10). Having a single implementation of delay test circuitry 22 serve a variety of circuits under test on integrated circuits 10 helps to conserve circuit resources. In practice, it may be desired to have more than one block of delay test circuitry 22 on integrated circuit 10 if, for example, circuits under test are located in different parts of integrated circuit 10.

The programmable aspect of delay test circuitry 22 enables delay test circuitry 22 to be implemented in a similar form on different types of integrated circuits 10 without additional customization. Different types of integrated circuit 10 may have delay circuits but the programmable aspect of delay test circuitry 22 may allow delay test circuitry 22 to be incorporated on different integrated circuits 10 with minimal or no redesign.

Delay test circuitry 22 typically requires only minimal circuit resources. This allows delay test circuitry 22 to be implemented on an integrated circuit 10, used for testing, and then deactivated before integrated circuit 10 is shipped to customers or otherwise put into normal use. Locating delay test circuitry 22 on the integrated circuit 10 along with circuits under test may help reduce the burden on external delay measurement apparatus. Locating delay test circuitry 22 on integrated circuit 10 may also help shorten paths between delay test circuitry 22 and circuits under test, which may result in greater precision and accuracy in the measurement of delay times. If desired, delay test circuitry 22 may be located with circuit under test 26 on a test chip that is used for testing purposes and not put into normal use or shipped to customers.

The foregoing is merely illustrative of the principles of this invention and various modifications can be made by those skilled in the art without departing from the scope and spirit of the invention.

What is claimed is:

1. Circuitry, comprising:
   a circuit under test that has an associated delay time; and
   delay test circuitry that is operable to use the circuit under test to produce a signal that has a pulse width that is equal to the associated delay time of the circuit under test.

2. The circuitry defined in claim 1, wherein the delay test circuitry has an associated time constant and wherein the delay test circuitry is operable to output an error signal of a given value when the associated delay time of the circuit under test is greater than the associated time constant of the delay test circuitry.

3. The circuitry defined in claim 2, wherein the delay test circuitry has a programmable load that determines the programmable time constant.

4. The circuitry defined in claim 3, wherein the programmable load comprises programmable resistor-capacitor elements and wherein each programmable resistor-capacitor element comprises a resistor and a capacitor.

5. The circuitry defined in claim 1, wherein the delay test circuitry comprises an inverter circuit and wherein the inverter circuit comprises:
   an input and an output;
   a p-channel metal-oxide-semiconductor transistor that has a gate terminal connected to the input;
   a first n-channel metal-oxide-semiconductor transistor that has a gate terminal connected to the input; and
   a second n-channel metal-oxide-semiconductor transistor connected between the p-channel metal-oxide-semiconductor transistor and the first n-channel metal-oxide-semiconductor transistor that has a gate terminal connected to a ground voltage.

6. The circuitry defined in claim 5 further comprising a programmable load connected to the output.

7. The circuitry defined in claim 1, wherein the circuit under test comprises a plurality of circuits under test, and wherein the delay test circuitry comprises a programmable multiplexer operable to select one of the plurality of circuits under test.

8. The circuitry defined in claim 1, wherein the delay test circuitry comprises a logic XOR gate having:
   a first input terminal connected to a reference signal; and
   a second input terminal that receives operable to receive an output signal from the circuit under test, wherein the output signal is delayed by the associated delay time with respect to the reference signal.

9. Circuitry, comprising:
   a circuit under test that has an associated adjustable delay time, wherein the adjustable delay time is adjusted with configuration data to produce a desired delay time; and
   delay test circuitry for testing whether the circuit under test has the desired delay time, wherein the delay test circuitry has an adjustable time constant and wherein the adjustable time constant is configured to correspond to the desired delay time using programmable memory elements.

10. The circuitry defined in claim 9, further comprising:
    programmable interconnects; and
    input-output pins, wherein the programmable interconnects are programmed to connect the delay test circuitry to the input-output pins.

11. Circuitry, comprising:
    a circuit under test that has an associated adjustable delay time; and
    delay test circuitry for testing the associated adjustable delay time of the circuit under test, wherein the delay test circuitry is configured using programmable memory elements, wherein the programmable memory elements configure the delay test circuitry to exhibit an associated time constant, wherein the delay test circuitry is configured to use an output signal from the circuit under test to produce a pulse that has a pulse width that is equal to the associated delay time of the circuit under test, and wherein the delay test circuitry has an output that is operable to supply an error signal of a given value when the associated delay time of the circuit under test is greater than the associated time constant of the delay test circuitry.

12. Circuitry, comprising:
    a circuit under test that receives a reference signal and that supplies a corresponding output signal after an associated delay time; and
    delay test circuitry, comprising:
      a logic XOR gate wherein the logic XOR gate comprises:
        a first input terminal that receives the reference signal; and
        a second input terminal that receives the output signal from the circuit under test, wherein the output signal is delayed by the associated delay time with respect to the reference clock signal; and
      a load that provides the delay test circuitry with an associated time constant, wherein the logic XOR gate produces a pulse that has a pulse width that is equal to the associated delay time of the circuit under test and wherein the delay test circuitry outputs an error signal of a given value when the associated delay time of the circuit under test is greater than the associated time constant of the delay test circuitry.

13. The circuitry defined in claim 12, further comprising programmable memory elements and wherein the load comprises a programmable load that is adjusted by the programmable memory elements.

14. Circuitry, comprising:
    a circuit under test that has an associated adjustable delay time; and
    delay test circuitry for testing the associated adjustable delay time of the circuit under test, wherein the delay test circuitry is configured use an output signal from the circuit under test to produce a pulse that has a pulse width that is equal to the associated delay time of the circuit under test.

15. The circuitry defined in claim 14, further comprising programmable memory elements, wherein the delay test circuitry is configured using the programmable memory elements.

16. The circuitry defined in claim 15, wherein the programmable memory elements configure the delay test circuitry to exhibit an associated time constant.

17. The circuitry defined in claim 16, wherein the delay test circuitry has an output that supplies an error signal of a given value when the associated adjustable delay time of the circuit under test is greater than the associated time constant of the delay test circuitry.

18. The circuitry defined in claim 14, wherein the delay test circuitry comprises:
- a logic XOR gate; and
- a load that provides the delay test circuitry with an associated time constant.

19. The circuitry defined in claim 18, wherein the delay test circuitry is configured to output an error signal of a given value when the associated adjustable delay time of the circuit under test is greater than the associated time constant of the delay test circuitry.

* * * * *